United States Patent
Yager et al.

(10) Patent No.: US 9,322,096 B2
(45) Date of Patent: Apr. 26, 2016

(54) COPPER SUBSTRATE FOR DEPOSITION OF GRAPHENE

(75) Inventors: Thomas A. Yager, Encinitas, CA (US); Joshua Robinson, University Park, PA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 369 days.

(21) Appl. No.: 13/817,533

(22) PCT Filed: May 25, 2012

(86) PCT No.: PCT/US2012/039633
§ 371 (c)(1),
(2), (4) Date: Feb. 18, 2013

(87) PCT Pub. No.: WO2013/176680
PCT Pub. Date: Nov. 28, 2013

(65) Prior Publication Data
US 2013/0316167 A1    Nov. 28, 2013

(51) Int. Cl.
*C23C 16/00*    (2006.01)
*C23C 16/26*    (2006.01)
(Continued)

(52) U.S. Cl.
CPC .............. *C23C 16/26* (2013.01); *C23C 16/0281* (2013.01); *C23C 16/545* (2013.01); *Y10T 428/265* (2015.01); *Y10T 428/30* (2015.01)

(58) Field of Classification Search
CPC .... C23C 16/26; C23C 16/0281; C23C 16/545
USPC ............................................ 427/249.1, 248.1
See application file for complete search history.

(56) References Cited

U.S. PATENT DOCUMENTS

| 5,525,753 A * | 6/1996 | Mennucci et al. ........... 174/16.3 |
| 2005/0269673 A1 | 12/2005 | Sugioka |
| 2010/0127312 A1 | 5/2010 | Grebel et al. |

(Continued)

FOREIGN PATENT DOCUMENTS

| KR | 2011053012 A * | 5/2011 |
| WO | 2012021677 A2 | 2/2012 |

OTHER PUBLICATIONS

Liu et al. Synthesis of high-quality monolayer and bilayer graphene on copper using chemical vapor deposition, Carbon, 2011, 49 pp. 4122-4130.*

(Continued)

*Primary Examiner* — Kelly M Gambetta
(74) *Attorney, Agent, or Firm* — Turk IP Law, LLC

(57) ABSTRACT

Technologies are presented for growing graphene by chemical vapor deposition (CVD) on a high purity copper surface. The surface may be prepared by deposition of a high purity copper layer on a lower purity copper substrate using deposition processes such as sputtering, evaporation, electroplating, or CVD. The deposition of the high purity copper layer may be followed by a thermal treatment to facilitate grain growth. Use of the high purity copper layer in combination with the lower purity copper substrate may provide thermal expansion matching, compatibility with copper etch removal, or reduction of contamination, producing fewer graphene defects compared to direct deposition on a lower purity substrate at substantially less expense than deposition approaches using a high purity copper foil substrate.

9 Claims, 9 Drawing Sheets

(51) Int. Cl.
*C23C 16/02* (2006.01)
*C23C 16/54* (2006.01)

(56) References Cited

U.S. PATENT DOCUMENTS

| | | | |
|---|---|---|---|
| 2010/0255984 A1 | 10/2010 | Sutter et al. | |
| 2011/0123776 A1* | 5/2011 | Shin et al. | 428/172 |
| 2011/0200787 A1 | 8/2011 | Regan et al. | |
| 2011/0269299 A1 | 11/2011 | Zhang et al. | |
| 2012/0088039 A1* | 4/2012 | Yu et al. | 427/596 |

OTHER PUBLICATIONS

Magnuson et al., "The Effects of Copper Substrate Structure and Impurities on the Quality of Graphene Growth," Bulletin of the American Physical Society APS March Meeting 2011, vol. 56, No. 1 Wednesday, Feb. 29, 2012.

Narula et.al., "Diffusivity and Solubility of Oxygen in Solid Copper Using Potentiostatic and Potentiometric Techniques." Metallurgical Transactions B, vol. 14B, Dec. 1983 pp. 673-677.

Li et al., "Supporting Online Material for Large-Area Synthesis of High-Quality and Uniform Graphene Films on Copper Foils." Published May 7, 2009 on Science Express. Retrieved from www.sciencemag.org/cgi/content/full/1171245/DC1.

Bae et.al., "Roll-to-Roll Production of 30-inch Graphene Films for Transparent Electrodes." Nature Nanotechnology 5, 574-578 (2010) doi: 10.1038/nnano.2010.158 Published online: Jun. 20, 2010. Retrieved online from URL: <http://www.nature.com/nnano/journal/v5/n8/full/nnano.2010.132.html>.

International Search Report and Written Opinion for PCT/US 12/39633, filed May 25, 2012, mailed on Oct. 12, 2012.

International Preliminary Report on Patentability for PCT/US2012/039633 filed May 25, 2012, mailed on Dec. 5, 2014, issued Nov. 25, 2014.

* cited by examiner

COMPUTER PROGRAM PRODUCT 800

SIGNAL-BEARING MEDIUM 802

804 AT LEAST ONE OF ONE OR MORE INSTRUCTIONS FOR

PROVIDING A COPPER SUBSTRATE THAT INCLUDES TWO CONTACTING LAYERS WITH THE COPPER PERCENTAGE OF THE FIRST LAYER GREATER THAN THE COPPER PERCENTAGE OF THE SECOND LAYER

PROVIDING THE FIRST LAYER

CLEANING A SURFACE OF THE FIRST LAYER

DEPOSITING THE SECOND LAYER ON THE SURFACE OF THE FIRST COPPER LAYER TO FORM THE COPPER SUBSTRATE

THERMALLY ANNEALING THE COPPER SUBSTRATE

GROWING A GRAPHENE MONOLAYER VIA CHEMICAL VAPOR DEPOSITION ON THE SECOND LAYER

| COMPUTER-READABLE MEDIUM 606 | RECORDABLE MEDIUM 608 | COMMUNICATIONS MEDIUM 610 |

FIG. 8

COPPER SUBSTRATE FOR DEPOSITION OF GRAPHENE

CROSS-REFERENCE TO RELATED APPLICATIONS

This application is the U.S. National Stage filing under 35 U.S.C. §371 of PCT Application No. PCT/US 12/39633, filed on May 25, 2012. The disclosure of the PCT Application is hereby incorporated by reference for all purposes.

BACKGROUND

Unless otherwise indicated herein, the materials described in this section are not prior art to the claims in this application and are not admitted to be prior art by inclusion in this section.

Graphene monolayers are one-atom-thick planar sheets of sp2-bonded carbon atoms with unique physical properties. This material is of interest for high speed integrated circuits, flexible displays, solar cells, and many other scientific and technological applications. However, many such applications may be dependent on graphene with a low defect density. One approach for producing large films of single layer graphene is chemical vapor deposition (CVD) on copper substrates. It has been demonstrated that CVD graphene grown on a 99.8% pure copper substrate may produce more than ten times the number of defects compared to CVD graphene grown on a 99.999% pure copper substrate. Unfortunately 99.999% pure copper may cost approximately ten to one hundred times that of 99.8% copper. Since the copper is etched away in the fabrication process, the value of the purity may be lost even though the copper may be reclaimed.

The present disclosure appreciates that improving the quality of CVD graphene may be a complex undertaking.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

The present disclosure generally describes methods, apparatus, and computer program products for to improving the growth of graphene by chemical vapor deposition.

According to some examples, a method of manufacturing graphene is provided. The method may include providing a copper substrate that may include a first copper layer in contact with a second copper layer. The first copper layer may be characterized by a first copper percentage by weight and the second copper layer may be characterized by a second copper percentage by weight. The second copper percentage may be greater than the first copper percentage. The method may also include growing a graphene monolayer via chemical vapor deposition on the second copper layer.

According to some examples, a copper substrate for growing a graphene monolayer is provided. The copper substrate may include a first copper layer characterized by: a first copper percentage by weight, a first oxygen percentage by weight, and a first thickness. The copper substrate may also include a second copper layer in contact with the first copper layer. The second copper layer may be characterized by: a second copper percentage by weight, a second oxygen percentage by weight, and a second thickness. In the copper substrate, the second copper percentage may be greater than the first copper percentage; the second oxygen percentage may be about the same or less than the first oxygen percentage; and the second average thickness may be less than the first average thickness.

According to some examples, a graphene-copper composite is provided. The graphene-copper composite may include a first copper layer characterized by: a first copper percentage by weight, a first oxygen percentage by weight, and a first thickness. The graphene-copper composite may include a second copper layer having a first surface in contact with the first copper layer. The second copper layer may be characterized by: a second copper percentage by weight, a second oxygen percentage by weight, and a second thickness. The graphene-copper composite may also include a graphene monolayer in contact with a second surface of the second copper layer. In the graphene-copper composite, the second copper percentage may be greater than the first copper percentage; the second oxygen percentage may be about the same or less than the first oxygen percentage; and the second average thickness may be less than the first average thickness.

According to some examples, a system for manufacturing a copper substrate for growing graphene is provided. The system may include a deposition chamber; a sample stage configured to hold a copper substrate in the deposition chamber; a copper deposition source; a cleaning agent source configured to direct cleaning agent to the copper substrate held by the sample stage; a sensor configured to determine a thickness of a layer deposited by the copper deposition source; a heater configured to heat the copper substrate held by the sample stage to an annealing temperature of about 750° C. to about 1000° C.; a gas source configured to provide a thermal annealing gas to the copper substrate held by the sample stage; and a microprocessor. The microprocessor may be coupled to the deposition chamber, the sample stage, the copper deposition source, the cleaning agent source, the sensor, and the heater. The microprocessor may be programmable to: employ the sample stage to hold a first copper layer in the deposition chamber; employ the cleaning agent source to direct cleaning agent to the first copper layer; employ the copper deposition source and the sensor to deposit a second copper layer on the first copper layer, wherein the second copper layer may be thinner compared to the first copper layer; and employ the heater and the gas source to thermally anneal the first copper layer at the copper substrate.

According to some examples, a computer-readable storage medium having instructions stored thereon for manufacturing a copper substrate for growing graphene is provided. The instructions may include providing a first copper layer; cleaning a surface of the first copper layer; depositing a second copper layer on the cleaned surface of the first copper layer to form the copper substrate; and thermally annealing the copper substrate. The first copper layer may be characterized by: a first copper percentage by weight, a first oxygen percentage by weight, and a first thickness. The second copper layer may be characterized by: a second copper percentage by weight, a second oxygen percentage by weight, and a second thickness. The second copper layer may be deposited such that one or more of: the second copper percentage may be greater than the first copper percentage, the second oxygen percentage may be about the same or less than the first oxygen percentage, and/or the second average thickness may be less than the first average thickness.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments arranged in accordance with the disclosure and are, therefore, not to be considered limiting of its scope, the disclosure will be described with additional specificity and detail through use of the accompanying drawings, in which:

FIG. 8 illustrates a block diagram of an example computer program product that may be used to control the automated machine of FIG. 7 or similar equipment in carrying out the described method of growing graphene on high purity copper, all arranged in accordance with at least some embodiments described herein.

DETAILED DESCRIPTION

Figure 1:
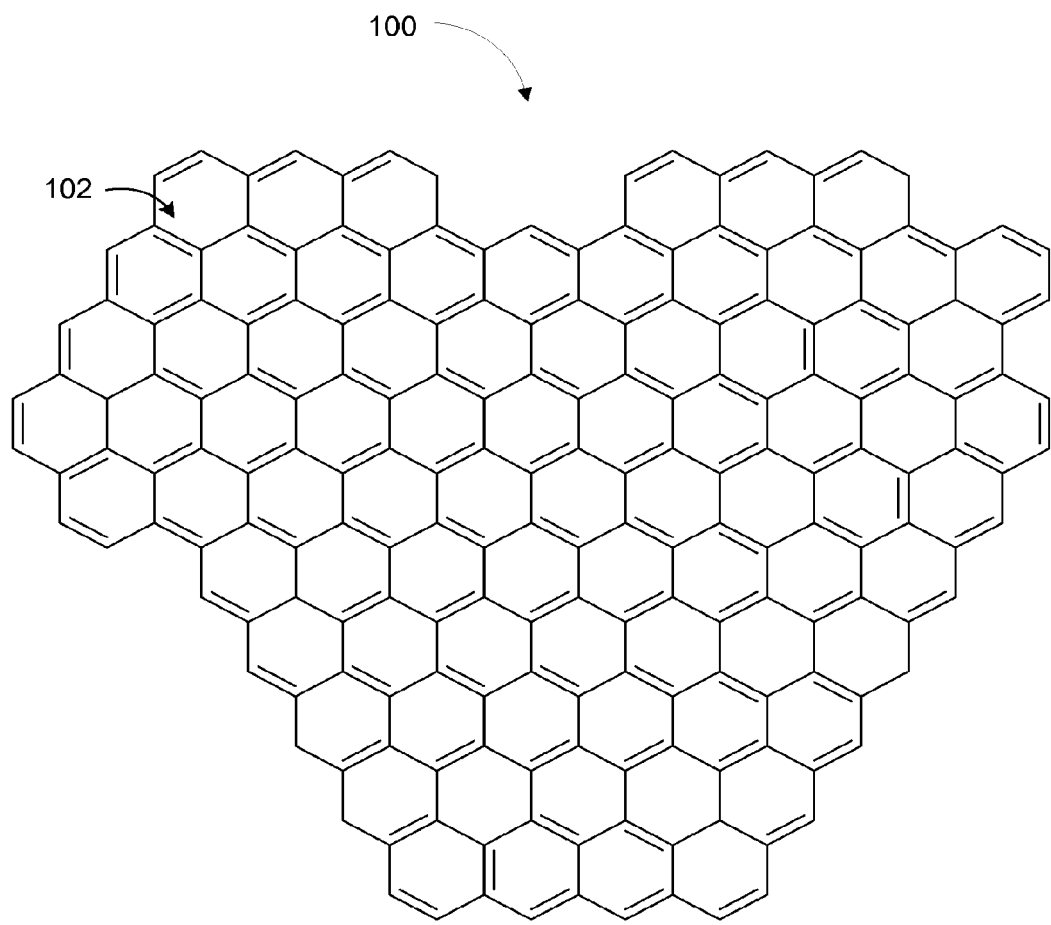
FIG. 1 is a conceptual chemical structure of a graphene monolayer.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to compositions, methods, apparatus, systems, devices, and/or computer program products related to improving the growth of graphene on copper by chemical vapor deposition.

Briefly stated, technologies are presented for growing graphene by chemical vapor deposition (CVD) on a high purity copper surface. The surface may be prepared by deposition of a high purity copper layer, e.g., 99.999% pure, on a lower purity copper substrate, e.g., 99.8% pure, using deposition processes such as sputtering, evaporation, electroplating, or CVD. The high purity copper layer can have a higher percent purity than the lower purity copper substrate. The deposition of the high purity copper layer may be followed by a thermal treatment to facilitate grain growth. Use of the high purity copper layer in combination with the lower purity copper substrate may provide thermal expansion matching, compatibility with copper etch removal, or reduction of contamination, producing fewer graphene defects compared to direct deposition on a lower purity substrate at substantially less expense than deposition approaches using a high purity copper foil substrate.

FIG. 1 is a conceptual chemical structure of a graphene monolayer 100, showing a one-atom-thick planar sheet of sp2 carbon atoms 102 that are densely packed in a hexagonal crystal lattice. Graphene is a basic structural element of carbon materials such as graphite, carbon nanotubes and fullerenes. Graphene monolayer 100 is an idealized structure, without defects. Idealized graphene is expected to have many interesting and useful properties, such as electrical conductivity, thermal conductivity, transparency, and mechanical stiffness. However, these properties may depend at least in part how well a particular graphene monolayer conforms to the idealized structure depicted for graphene monolayer 100. For example, ab initio calculations have been reported which show that a graphene monolayer may be thermodynamically less stable than fullerene structures if its size is less than about 20 nanometers in diameter or about 6000 atoms, but the graphene monolayer may be thermodynamically more stable compared to fullerene structures sizes larger than about 24,000 carbon atoms. For at least these reasons, the reduction of defects in graphene may be of great interest.

Figure 2:
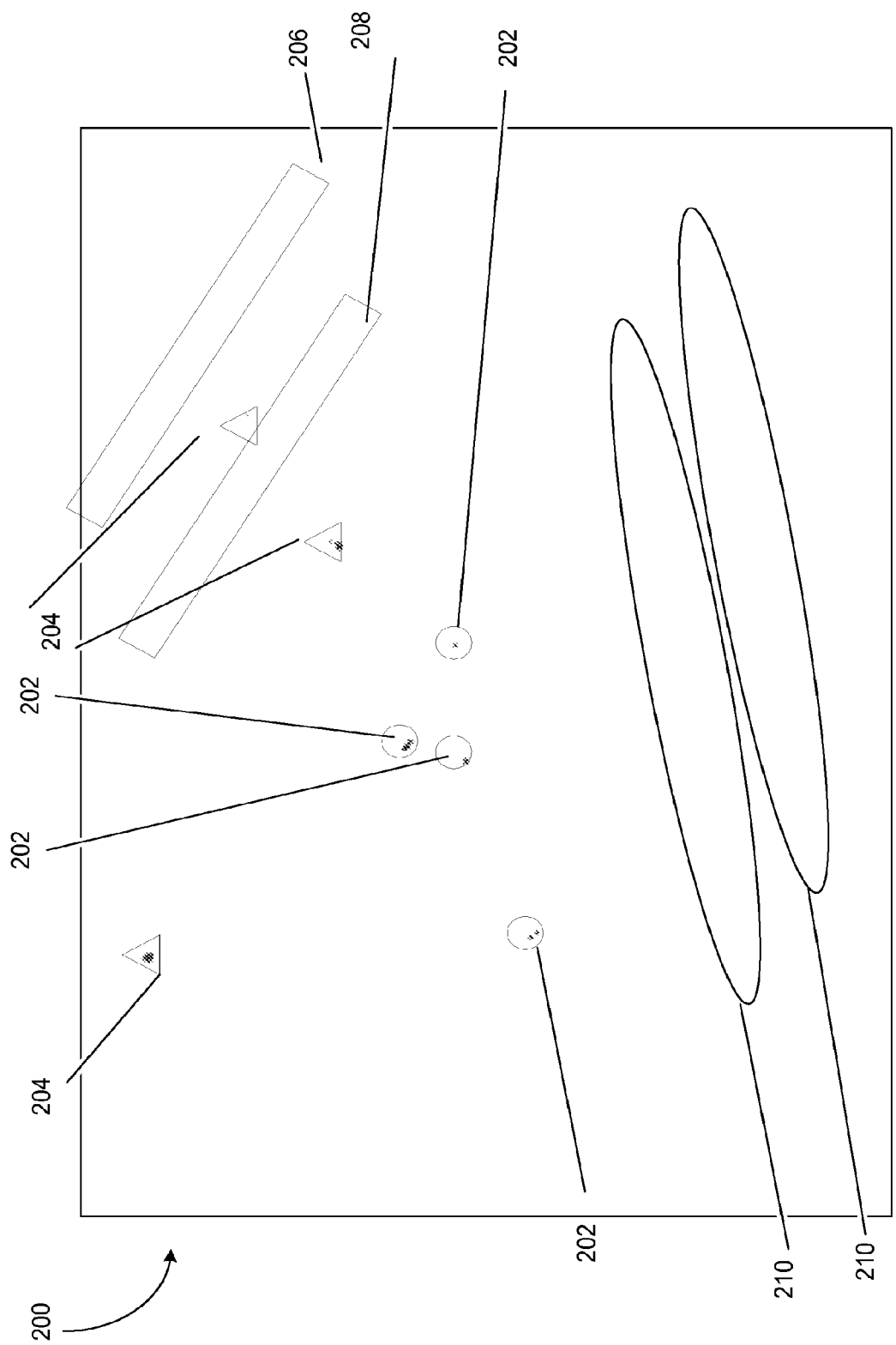
FIG. 2 is a conceptual representation of a photomicrograph of defects in graphene grown on 99.8% pure copper.

FIG. 2 is a conceptual representation of a photomicrograph of various defects in a sample of graphene grown on 99.8% pure copper. FIG. 2 shows a diagram 200 of a number of defects that may be visually characterized as dark spots (202), light spots (204), multilayer graphene (206 & 208), and defective streaks (210).

Figure 3:
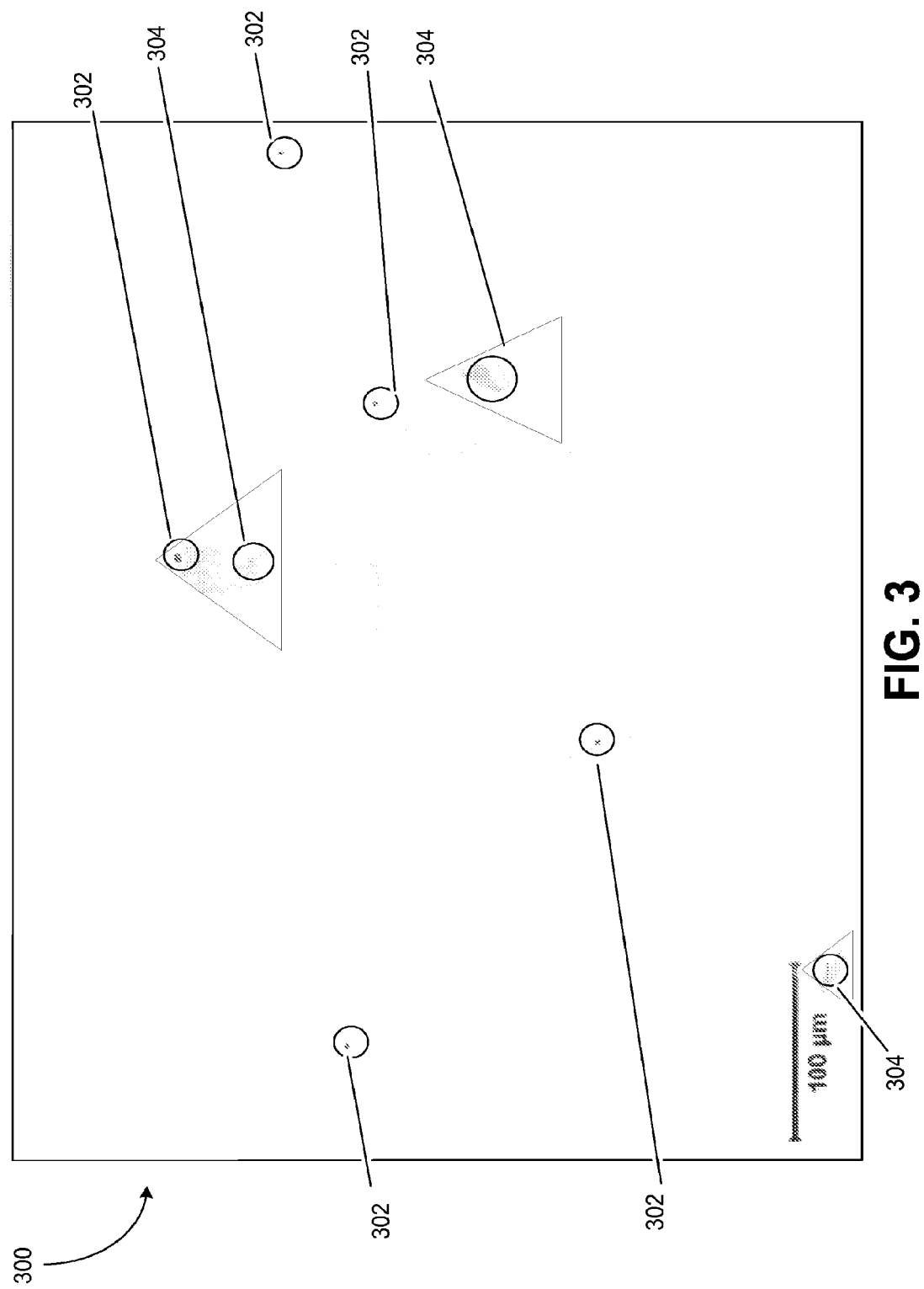
FIG. 3 is a conceptual representation of a photomicrograph of defects in graphene grown on high purity 99.999% copper as described herein.

FIG. 3 is a conceptual representation of a photomicrograph of various defects in a sample of graphene grown on 99.999% pure copper. FIG. 3 shows a diagram 300 of fewer spot defects 202 and 304. There are fewer defects overall, for example, none of the multilayer graphene or defective streaks 206, 208 and 210 found in FIG. 2 are observed in FIG. 3. It has been documented that CVD graphene grown on a 99.8% pure copper substrate, such as in FIG. 2, may produce more than ten times the number of defects compared to CVD graphene grown on a 99.999% pure copper substrate, such as in FIG. 3. Unfortunately 99.999% pure copper may cost considerably more than 99.8% copper, between ten to one hundred times more at current prices. Moreover, under known approaches, the copper may be etched away in the fabrication process, so the value of the high purity copper may be lost even though the copper may be reclaimed.

Figure 4A:
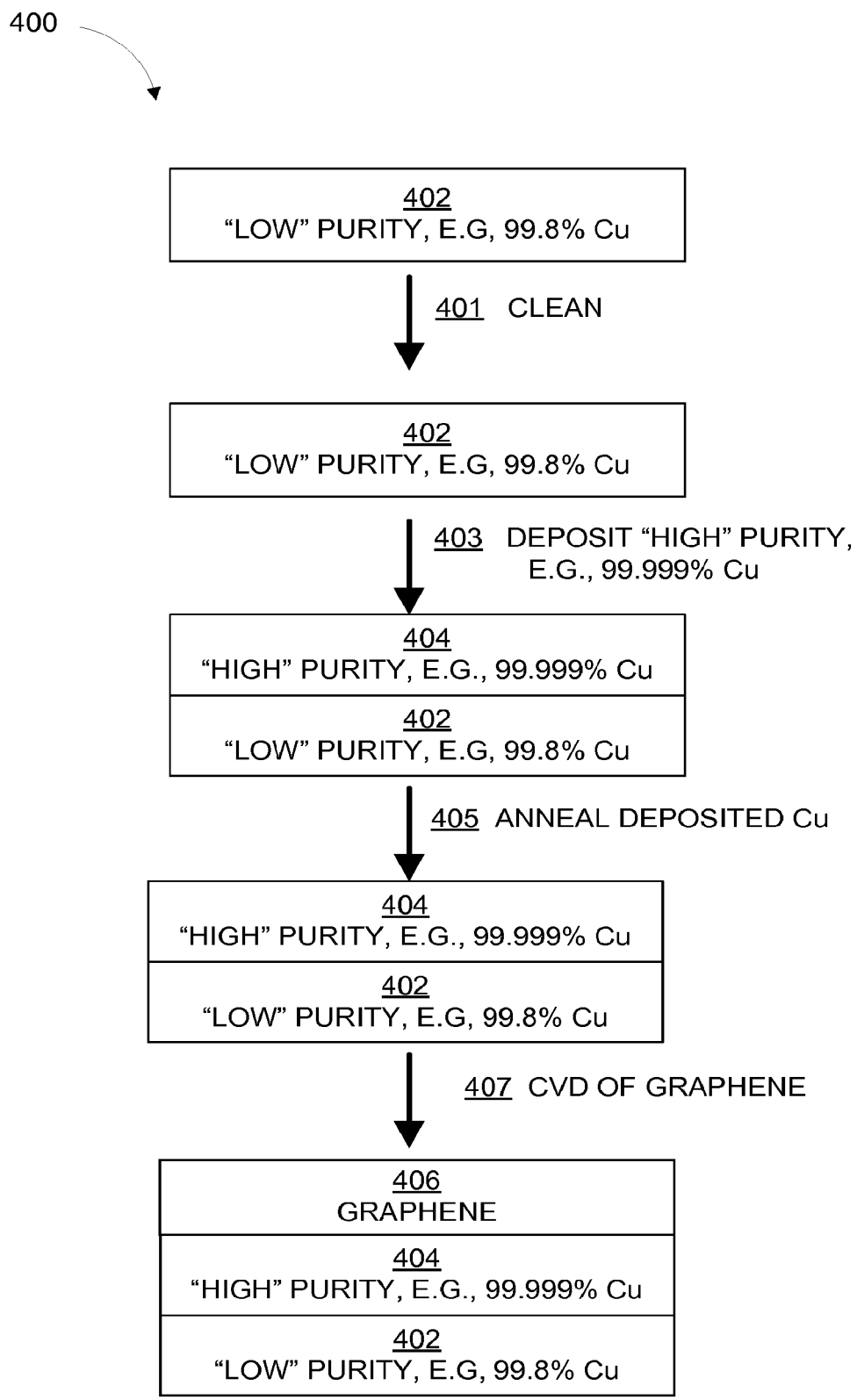
FIG. 4A is a conceptual illustration of operations in growing graphene on high purity copper as described herein.

FIG. 4A is a conceptual illustration of operations in growing graphene on high purity copper as described herein. In a diagram 400A, a sample of low-purity copper 402 may be used in the form of a slab, or a foil laid on a further substrate.

The low-purity copper 402 may be cleaned in operation 401, for example using sputter cleaning, acid etching, solvent rinsing/degreasing, electropolishing, chemical mechanical polishing, or other suitable cleaning processes. Suitable acid etching processes may employ, for example, carboxylic acids such as acetic acid, citric acid, maleic acid, oxalic acid, or glycolic acid. Suitable solvents may include, for example, alkanes such as pentane, hexane, or cyclohexane; halogenated solvents such as dichloromethane, trichloroethylene, or chlorofluorocarbons; aromatic solvents such as benzene, toluene, or xylenes; alcohols such as methanol, ethanol, or 2-propanol; or ketones such as acetone or methyl ethyl ketone.

Next, in operation 403, high-purity copper layer 404 may be laid on low-purity copper 402, for example by sputtering, evaporation, electroplating, chemical vapor deposition (CVD), or other suitable high purity deposition processes. By using a thin film of high purity copper such as high-purity copper layer 404 on top of standard purity copper foil such as low-purity copper 402, higher quality graphene may be grown on high purity copper while reducing the amount of high purity copper used. Use of the low purity copper 402 may improve interfacial bonding with the high-purity copper layer 404, for example by matching thermal expansion coefficients at the interface. Also, the same or similar copper etch process may be used for removal of copper from the graphene.

The high-purity copper layer 404, as deposited, may have a small grain size. Grain boundaries may produce lower quality graphene such as during a CVD growth operation. Accordingly, in operation 405, the high-purity copper layer 404 may be thermally annealed, which may lead to grain growth and reduction in grain boundary density. Suitable thermal annealing conditions may be selected to promote grain growth, avoid copper vaporization, and avoid surface oxidation of the copper. Suitable thermal annealing conditions may include heating to an annealing temperature of about 750° C. to about 1000° C., or in some examples about 800° C. to about 900° C. Specific examples of annealing temperatures include about 750° C., about 800° C., about 850° C., about 900° C., about 950° C., about 1000° C., and ranges between any two of these values. Suitable thermal annealing conditions may also include heating in the absence of oxygen, for example in a vacuum. In other examples, a suitable atmosphere for thermal annealing may include one or more noble gases, e.g., helium, neon, argon, or xenon, in a concentration of about 90 mole % to about 99 mole %. A suitable atmosphere for thermal annealing may also include hydrogen in a concentration of about 1 mole % to about 10 mole %. In a specific example, a thermal annealing operation may include heating to about 800° C. to about 900° C. in an atmosphere of 95 mole % argon and 5 mole % hydrogen.

Figure 4B:
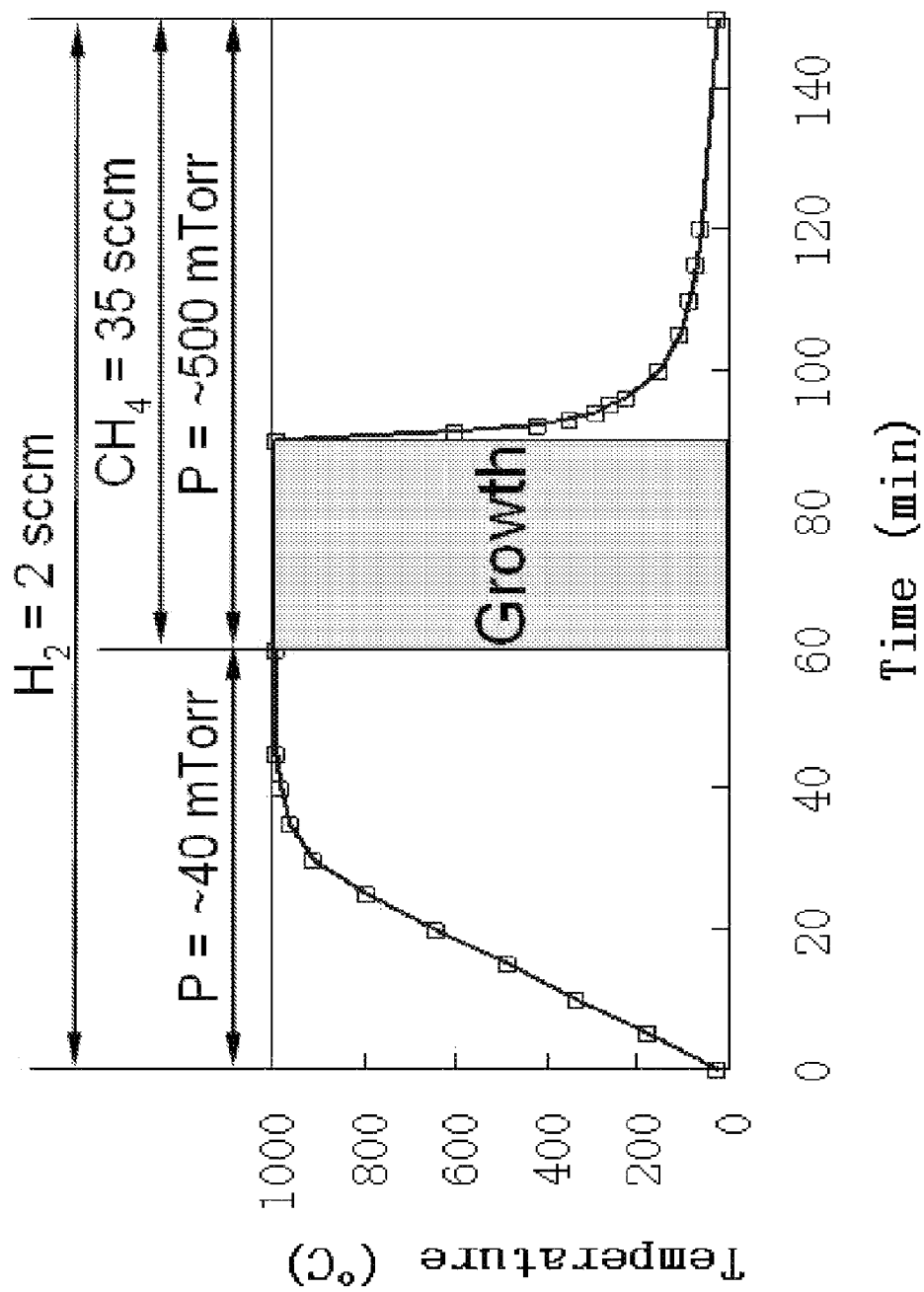
FIG. 4B is a graph outlining an example of graphene growth conditions.

In operation 407, a graphene layer 406 may be deposited on the high-purity copper layer 404. Any suitable approach for growing graphene may be employed, for example, the various approaches of growing graphene via CVD. One specific example of graphene growth is outlined in the graph depicted in FIG. 4B. The combination of copper layers 402 and 404 may be placed in a CVD chamber under about 2 standard cubic centimeters per minute (sccm) of hydrogen gas at a pressure of about 40 milliTorr. The combined copper layers 402/404 may be heated to a temperature of about 1000° C. over a period of about 45 minutes, and the temperature may be allowed to stabilize, for example for another 15 minutes. A CVD growth gas such as methane may be admitted, for example, at a flow of about 35 sccm to reach a total chamber pressure of about 500 milliTorr. The hydrogen flow may be continued at about 2 sccm. The graphene may be allowed to grow for a period of time, for example about 30 minutes. The CVD chamber heater may then be shut off, and the CVD chamber may be allowed to cool to ambient temperature, for example over about 50 minutes. During cooling, the gas flow may be maintained at about 2 sccm of hydrogen and about 35 sccm of methane, while the pressure may be maintained, for example at about 500 milliTorr.

The layers of low-purity copper 402 and high-purity copper 404 may each be characterized by average thickness. For example, the low-purity copper 402 may be in any suitable thickness from about 3 micrometers to about 300 micrometers. Specific thickness examples include about 3 micrometers, about 10 micrometers, about 25 micrometers, about 50 micrometers, about 100 micrometers, about 150 micrometers, about 200 micrometers, about 250 micrometers, about 300 micrometers, and ranges between any two of these values. As an example, a suitable thickness for small area samples may be about 25 micrometers thick. For ease of handling, larger samples may employ thicker layers, for example, 100 micrometers thick. The high-purity copper 404 may be in any suitable thickness from a single atomic monolayer to about 25 micrometers thick. For example, the high-purity copper 404 may be from about 0.1 micrometers to about 1 micrometer in thickness. Specific thickness examples include about 0.1 micrometers, about 0.2 micrometers, about 0.3 micrometers, about 0.4 micrometers, about 0.5 micrometers, about 0.6 micrometers, about 0.7 micrometers, about 0.8 micrometers, about 0.9 micrometers, about 1.0 micrometers, and ranges between any two of these values. In addition, the low-purity copper 402 may have a greater average thickness compared to the high-purity copper 404.

The layers of low-purity copper 402 and high-purity copper 404 may each be characterized by copper percentage by weight. The high-purity copper 404 may have a greater copper percentage by weight compared to the low-purity copper 402, e.g., by at least about 0.1%. For example, the high-purity copper 404 may have a copper percentage by weight of about 99.9% or more. In other examples, the low-purity copper 402 may have a copper percentage by weight of about 99.9% or less. As a specific example, the high-purity copper 404 may be 99.999% copper by weight and the low-purity copper 302 may be about 99.8% copper by weight.

The layers of low-purity copper 402 and high-purity copper 404 may each be characterized by oxygen percentage by weight. As used herein, "oxygen percentage by weight" includes oxygen present in any form, for example, dissolved oxygen or precipitated oxygen compounds of metals or other elements. The oxygen percentage by weight may be expressed as an equivalent parts per million (ppm) by weight, for example, 0.01% by weight is equivalent to 100 ppm by weight. In various examples, the oxygen percentage by weight of the high-purity copper 404 is about the same or less compared to the low-purity copper 402. The low purity copper 402 may be characterized by an oxygen percentage by weight of less than 1%, in some examples less than about 0.2%. The low purity copper 402 may be characterized by an oxygen percentage by weight of less than 0.0028% or 28 ppm, in some examples less than about 0.001% or 10 ppm.

Copper may also be characterized by dissolved oxygen percentage by weight, e.g., high purity copper 404 may be saturated in dissolved oxygen at the annealing temperature. For example, at 1000° C., the saturated solubility of oxygen in copper, e.g., high purity copper 404, is 0.0028% by weight or 28 ppm by weight. Without wishing to be bound by theory, saturating the high purity copper layer 404 in dissolved oxygen may block further diffusion of oxygen from the low-purity copper layer 402 to the high-purity copper layer 404, which may reduce graphene defect formation. It is not currently known whether typical graphene defects correlate to any typical impurity in 99.8% copper, however, it is known that common impurities in 99.8% copper may include oxygen, nickel, and iron, of which oxygen is generally the single greatest impurity. It is believed that nickel and iron may be less likely to cause graphene defects, at least at low concentrations, because nickel and iron may catalyze the formation of graphene under CVD conditions. It is also believed that the presence of oxygen may interfere with the catalytic formation of graphene in CVD, which may lead to the observed defects.

In further examples, the high-purity copper 404 may be saturated in oxygen at the annealing temperature and/or at the graphene growth temperature. Likewise, the low-purity copper 402 may be saturated in oxygen at the annealing temperature and/or at the graphene growth temperature. In further examples, both the high-purity copper 404 and the low-purity copper 402 may be saturated in oxygen at the annealing and graphene growth temperatures.

Example embodiments may also include methods of manufacturing graphene as described herein. These methods may be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. The various human operators need not be collocated with each other, and instead each operated can be located about one or more machines that perform a portion of the operations. In other examples, the human interaction may be automated such as by pre-selected criteria that may be machine automated.

Figure 5:
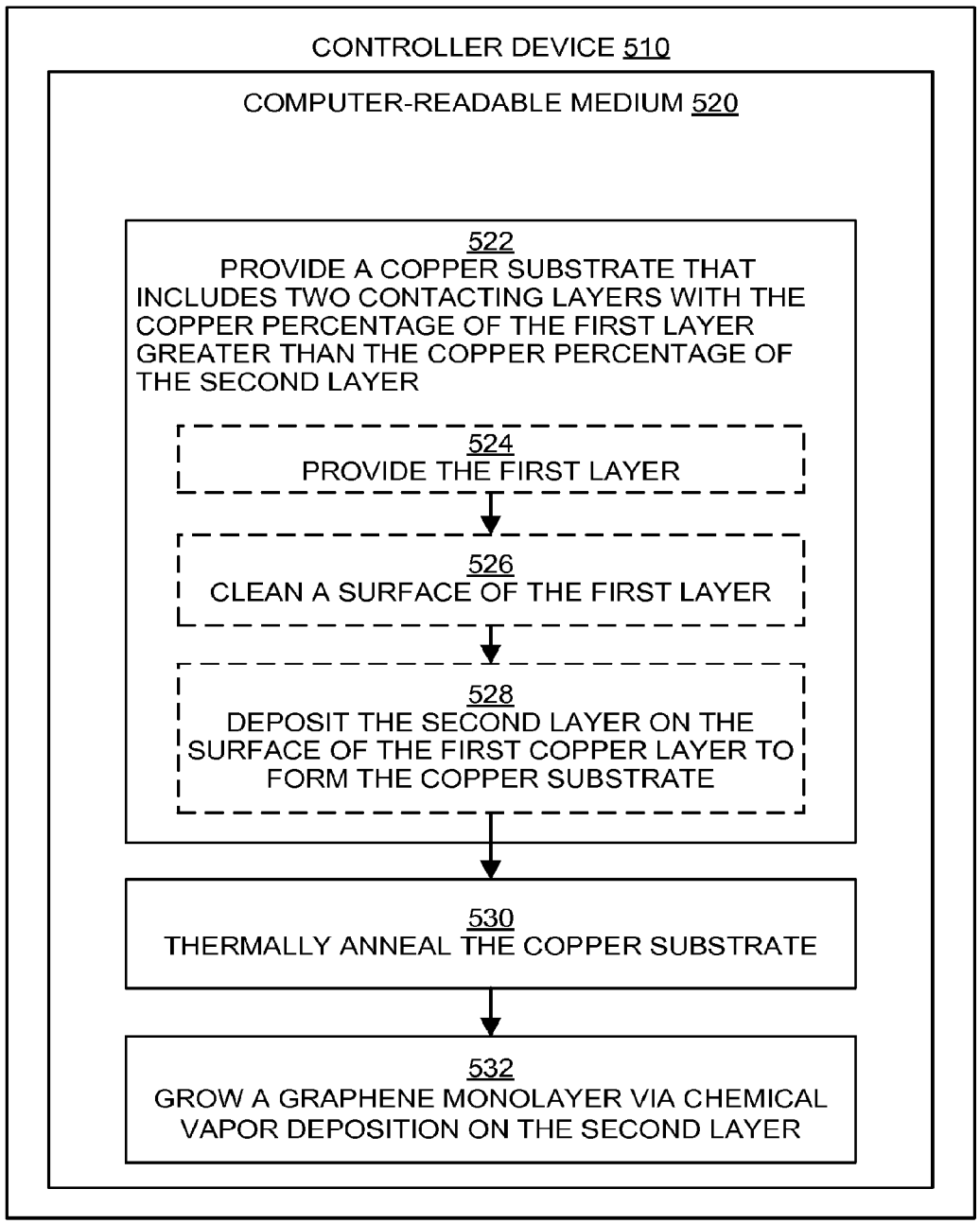
FIG. 5 is a flow diagram showing example operations that may be used for carrying out the described method of growing graphene on high purity copper.

FIG. 5 is a flow diagram showing operations that may be used in manufacturing graphene, arranged in accordance with at least some embodiments described herein. A process of manufacturing graphene as described herein may include one or more operations, functions or actions as is illustrated by one or more of operations 522, 524, 526, 528, 530, and/or 532. An example method of manufacturing graphene as described herein may be operated by a controller device 510, which may be embodied as computing device 700 in FIG. 7 or a special purpose controller such as manufacturing controller 690 of FIG. 6, or similar devices configured to execute instructions stored in computer-readable medium 520 for controlling the performance of the method.

Some example processes may begin with operation 522, "PROVIDE A COPPER SUBSTRATE THAT INCLUDES TWO CONTACTING LAYERS WITH THE COPPER PERCENTAGE OF THE FIRST LAYER GREATER THAN THE COPPER PERCENTAGE OF THE SECOND LAYER." Operation 522 may be performed, for example, by manual or automatic loading of the copper substrate sample into a sample stage, or by preparing the copper substrate as provided in optional operations 524, 526, and/or 528.

For example, operation 522 may be followed by operation 524, "PROVIDE THE FIRST LAYER." Operation 524 may include manual or automatic loading of the first copper layer into a sample stage.

Operation 524 may be followed by operation 526, "CLEAN A SURFACE OF THE FIRST LAYER." Operation 526 may include contacting the surface of the first layer with a cleaning agent from a cleaning source. For example, the cleaning source may include a reservoir of a cleaning agent and an applicator for contacting the cleaning agent to the surface of the first layer. The cleaning source may include a liquid applicator and a cleaning agent reservoir. For example, acid etching of the surface of the first layer may be conducted by applying an acid from the cleaning agent source such as acetic acid, citric acid, maleic acid, oxalic acid, or glycolic acid. The cleaning agent source may also supply a solvent for cleaning, for example: alkanes such as pentane, hexane, or cyclohexane; halogenated solvents such as dichloromethane, trichloroethylene, or chlorofluorocarbons; aromatic solvents such as benzene, toluene, or xylenes; or alcohols such as methanol, ethanol, or 2-propanol. The cleaning source may also include a sputter source for sputter cleaning of the surface of the first layer.

Operation 526 may be followed by operation 528, "DEPOSIT THE SECOND LAYER ON THE SURFACE OF THE FIRST COPPER LAYER TO FORM THE COPPER SUBSTRATE." Operation 526 may be conducted by any copper deposition source suitable for high purity deposition, for example, by sputtering, evaporation, electroplating, chemical vapor deposition (CVD), or other high purity deposition processes.

Operations 522, 524, 526 and 528 may be followed by operation 530, "THERMALLY ANNEAL THE COPPER SUBSTRATE". This may be accomplished using a heater and may be conducted in an environment substantially free of oxygen, for example, a vacuum, or a partial pressure of one or more noble gases and/or hydrogen, as described herein.

Operation 530 may be followed by operation 532, "GROW A GRAPHENE MONOLAYER VIA CHEMICAL VAPOR DEPOSITION ON THE SECOND LAYER." The graphene may be grown using any suitable approach for growing graphene via CVD, for example, the CVD methods of growing graphene described herein. The graphene is grown in at least a monolayer, and additional graphene layers may be grown.

The operations included in the process of FIG. 5 described above are for illustration purposes. A process of growing graphene as described herein may be implemented by similar processes with fewer or additional operations. In some examples, the operations may be performed in a different order. In some other examples, various operations may be eliminated. In still other examples, various operations may be divided into additional operations, or combined together into fewer operations. Although illustrated as sequentially ordered operations, in some implementations the various operations may be performed in a different order, or in some cases various operations may be performed at substantially the same time. For example, any other similar process may be implemented with fewer, different, or additional operations so long as such similar processes grow graphene using the copper substrate.

Figure 6:
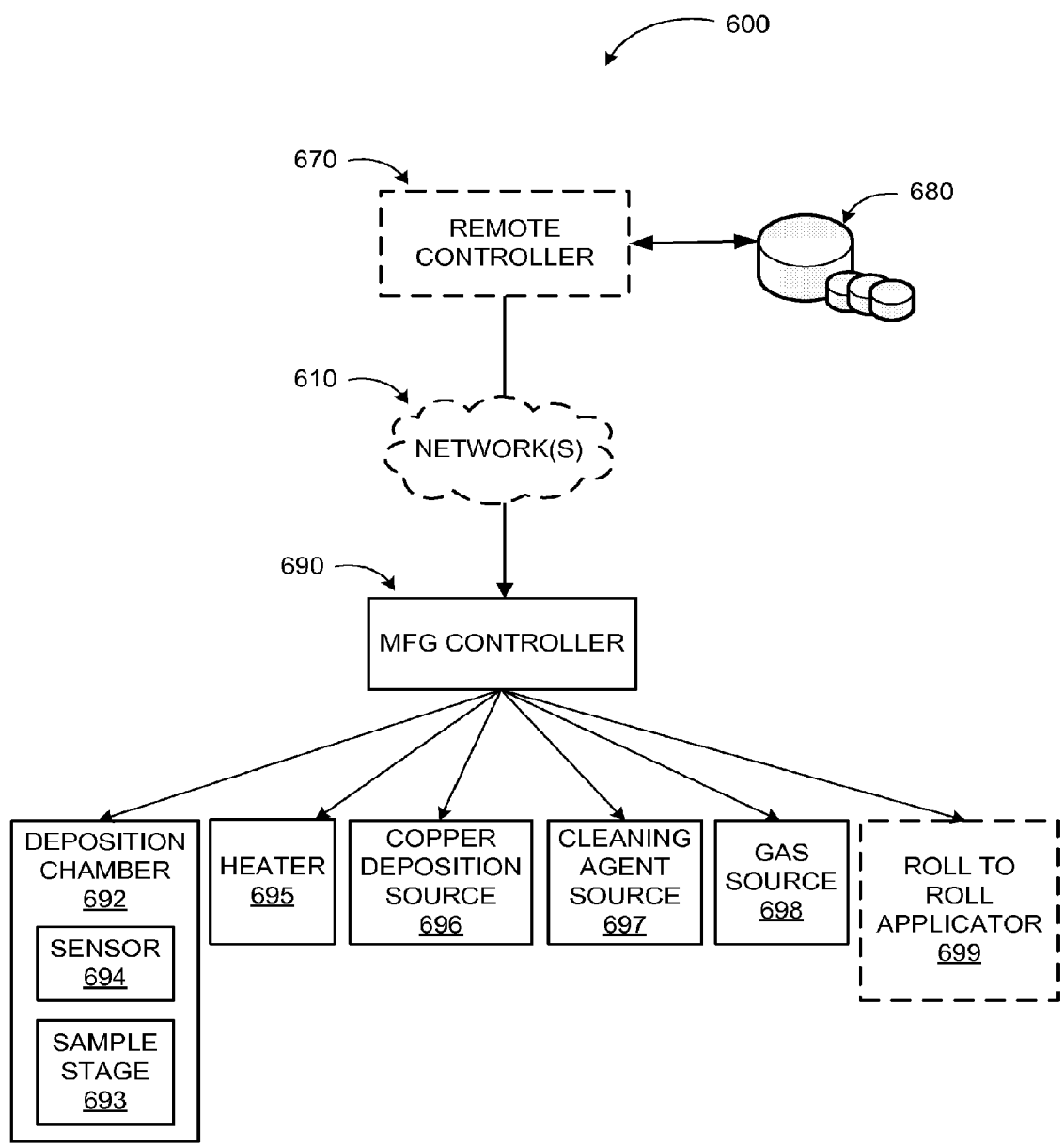
FIG. 6 is a block diagram of an automated machine that may be used for carrying out the described method of growing graphene on high purity copper.

FIG. 6 is a block diagram of a manufacturing system 600 that may be used for of growing graphene and preparing the copper substrate as described herein using the process operations outlined in FIG. 5, arranged in accordance with at least some embodiments described herein. As illustrated in FIG. 6, a manufacturing controller 690 may be coupled to the machines that may be employed to carry out the operations described in FIG. 5, for example: a deposition chamber 692; a sample stage 693; one or more sensors 694 such as temperature sensors or copper thickness sensors; a heater 695; a copper deposition source 696; a cleaning agent source 697; a gas source 698; and an optional roll to roll applicator 699.

Manufacturing controller 690 may be operated by human control, by a remote controller 670 via network 610, or by machine executed instructions such as might be found in a computer program. Data associated with controlling the different processes of manufacturing graphene may be stored at and/or received from data stores 680. Further, the individual elements of manufacturing system 600 may be implemented as any suitable device configured in any suitable fashion for carrying out the operations described herein. For example, sample stage 620 may be stationary or may include one or more moving functions, such as translation in zero, one, two, or three perpendicular axes, rotation in one, two, or three perpendicular axes, or combinations thereof. Such moving functions may be provided by motors, linear actuators, or piezoelectric actuators. Likewise, copper deposition source 696 may be configured for any approach for depositing high purity copper, such as by sputtering, evaporation, atomic or chemical vapor deposition, or high purity electroplating. Similarly, cleaning agent source 697 may be configured for any suitable approach for cleaning a copper surface, for example, a liquid applicator and a cleaning agent reservoir suitable for solvents or acid etchants, or a sputter cleaner. Further, gas source 698 may be any combination of gas reservoirs, valves, pressure sensors, or manifolds capable of providing process gases, such as noble gases, hydrogen, or graphene CVD source gases such as methane. Moreover, optional roll to roll applicator 699 may be desirable for large area applications or other situations where continuous preparation of the copper layers and CVD deposition may be conducted without additional handling or exposure of the substrate to atmospheric gases.

Figure 7:
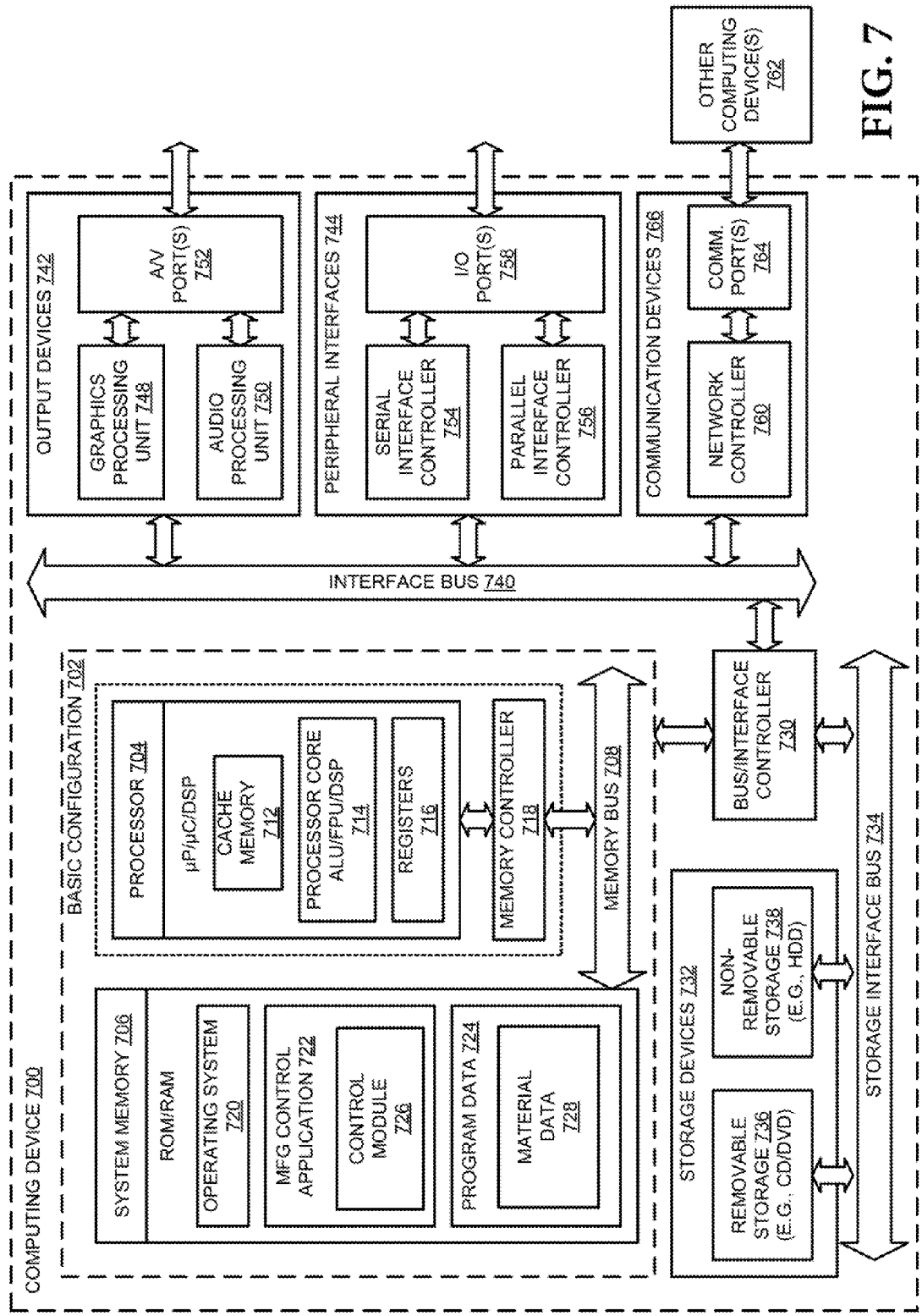
FIG. 7 illustrates a general purpose computing device that may be used to control the automated machine of FIG. 6 or similar equipment in carrying out the described method of growing graphene on high purity copper.

FIG. 7 illustrates a general purpose computing device that may be used to control the manufacturing system 600 of FIG. 6 or similar manufacturing equipment in growing graphene, arranged in accordance with at least some embodiments described herein. In a basic configuration 702, referring to the components within the dashed line, computing device 700 typically may include one or more processors 704 and a system memory 706. A memory bus 708 may be used for communicating between processor 704 and system memory 706.

Depending on the desired configuration, processor 704 may be of any type including but not limited to a microprocessor (µP), a microcontroller (µC), a digital signal processor (DSP), or any combination thereof. Processor 704 may include one more levels of caching, such as a cache memory 712, a processor core 714, and registers 716. Processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, system memory 706 may be of any type including but not limited to volatile memory (such as RAM), non-volatile memory (such as ROM, flash memory, etc.) or any combination thereof. System memory 706 may include an operating system 720, one or more manufacturing control applications 722, and program data 724. Manufacturing control application 722 may include a control module 726 that may be arranged to control manufacturing system 600 of FIG. 6 and any other processes, methods and functions as discussed above. Program data 724 may include, among other data, material data 728 for controlling various aspects of the manufacturing system 600.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices may include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 706, removable storage devices 736 and non-removable storage devices 738 may be examples of computer storage media. Computer storage media may include, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 700. Any such computer storage media may be part of computing device 700.

Computing device 700 may also include an interface bus 740 for facilitating communication from various interface devices (e.g., output devices 742, peripheral interfaces 744, and communication devices 766) to basic configuration 702 via bus/interface controller 730. Output devices 742 may include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. A communication device 766 may include a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 700 may be implemented as a portion of a physical server, virtual server, a computing cloud, or a hybrid device that include any of the above functions. Computing device 700 may also be implemented as a personal computer including both laptop computer and non-laptop computer configurations. Moreover computing device 700 may be implemented as a networked system or as part of a general purpose or specialized server.

Networks for a networked system including computing device 700 may comprise any topology of servers, clients, switches, routers, modems, Internet service providers, and any appropriate communication media (e.g., wired or wireless communications). A system according to embodiments may have a static or dynamic network topology. The networks may include a secure network such as an enterprise network (e.g., a LAN, WAN, or WLAN), an unsecure network such as a wireless open network (e.g., IEEE 802.11 wireless networks), or a world-wide network such (e.g., the Internet). The networks may also comprise a plurality of distinct networks that may be adapted to operate together. Such networks may be configured to provide communication between the nodes described herein. By way of example, and not limitation, these networks may include wireless media such as acoustic, RF, infrared and other wireless media. Furthermore, the networks may be portions of the same network or separate networks.

FIG. 8 illustrates a block diagram of an example computer program product that may be used to control the automated machine of FIG. 6 or similar manufacturing equipment in manufacturing graphene, arranged in accordance with at least some embodiments described herein. In some examples, as shown in FIG. 8, computer program product 800 may include a signal bearing medium 802 that may also include machine readable instructions 804 that, when executed by, for example, a processor, may provide the functionality described above with respect to FIG. 5 through FIG. 7. For example, referring to manufacturing controller 690, one or more of the tasks shown in FIG. 8 may be undertaken in response to machine readable instructions 804 conveyed to the imaging controller 690 by signal bearing medium 802 to perform actions associated with growing graphene as described herein. Some of those instructions may include, for example, one or more instructions for: "providing a copper substrate that includes two contacting layers with the copper percentage of the first layer greater than the copper percentage of the second layer;" "providing the first layer;" "cleaning a surface of the first layer;" "depositing the second layer on the surface of the first copper layer to form the copper substrate;" "thermally annealing the copper substrate;" or "growing a graphene monolayer via chemical vapor deposition on the second layer."

In some implementations, signal bearing medium 802 depicted in FIG. 8 may encompass a computer-readable medium 806, such as, but not limited to, a hard disk drive, a Compact Disc (CD), a Digital Versatile Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communications link, a wireless communication link, etc.). For example, computer program product 800 may be conveyed to the processor 704 by an RF signal bearing medium 802, where the signal bearing medium 802 may be conveyed by a communications medium 810 (e.g., a wireless communications medium conforming with the IEEE 802.11 standard). While the embodiments will be described in the general context of program modules that execute in conjunction with an application program that runs on an operating system on a personal computer, those skilled in the art will recognize that aspects may also be implemented in combination with other program modules.

Generally, program modules include routines, programs, components, data structures, and other types of structures that perform particular tasks or implement particular abstract data types. Moreover, those skilled in the art will appreciate that embodiments may be practiced with other computer system configurations, including hand-held devices, multiprocessor systems, microprocessor-based or programmable consumer electronics, minicomputers, mainframe computers, and comparable computing devices. Embodiments may also be practiced in distributed computing environments where tasks may be performed by remote processing devices that may be linked through a communications network. In a distributed computing environment, program modules may be located in both local and remote memory storage devices.

Embodiments may be implemented as a computer-implemented process (method), a computing system, or as an article of manufacture, such as a computer program product or computer readable media. The computer program product may be a computer storage medium readable by a computer system and encoding a computer program that comprises instructions for causing a computer or computing system to perform example process(es). The computer-readable storage medium can for example be implemented via one or more of a volatile computer memory, a non-volatile memory, a hard drive, a flash drive, a floppy disk, or a compact disk, and comparable media.

Throughout this specification, the term "platform" may be a combination of software and hardware components for providing a configuration environment, which may facilitate configuration of software/hardware products and services for a variety of purposes. Examples of platforms include, but are not limited to, a hosted service executed over a plurality of servers, an application executed on a single computing device, and comparable systems. The term "server" generally refers to a computing device executing one or more software programs typically in a networked environment. However, a server may also be implemented as a virtual server (software programs) executed on one or more computing devices viewed as a server on the network. More detail on these technologies and example operations is provided below.

According to some examples, a method of manufacturing graphene is provided. The method may include providing a copper substrate that may include a first copper layer in contact with a second copper layer. The first copper layer may be characterized by a first copper percentage by weight and the second copper layer may be characterized by a second copper percentage by weight. The second copper percentage may be greater than the first copper percentage. The method may also include growing a graphene monolayer via chemical vapor deposition on the second copper layer. Providing the copper substrate may include: providing the first copper layer; cleaning a surface of the first copper layer; depositing the second copper layer on the cleaned surface of the first copper layer to form the copper substrate; and thermally annealing the copper substrate.

In various examples of the method, the first copper layer may be further characterized by a first oxygen percentage by weight; the second copper layer may be further characterized by a second oxygen percentage by weight; and the second oxygen percentage may be about the same or less than the first oxygen percentage. In a dimension perpendicular to the graphene monolayer, the first copper layer may be characterized by a first average thickness; the second copper layer may be characterized by a second average thickness; and the second average thickness may be less than the first average thickness. The second average thickness may be one atomic monolayer of copper to about 25 micrometers. The first average thickness may be at least about 3 micrometers.

In other examples of the method, the second copper percentage may be greater than the first copper percentage by at least about 0.1%. In some examples, the second copper percentage may be at least about 99.9%; the first copper percentage may be less than about 99.9%; or the second copper percentage may be at least about 99.9% and the first copper percentage may be less than about 99.9%.

In various examples of the method, the surface of the first copper layer may be cleaned by one or more of sputter cleaning, acid etching, solvent rinsing, electropolishing, or chemical mechanical polishing. The second copper layer may be deposited on the surface of the first copper layer by one or more of sputtering, evaporation, electroplating, or chemical vapor deposition (CVD).

In some examples of the method, thermal annealing may include heating to an annealing temperature of about 750° C. to about 1000° C. The second copper layer may be saturated in dissolved oxygen at the annealing temperature. The thermal annealing may include heating in an atmosphere that includes: about 1 mole % hydrogen to about 10 mole % hydrogen, and about 90 mole % to about 99 mole % of one or more noble gases. The thermal annealing may include heating in an atmosphere substantially free of oxygen.

According to some examples, a copper substrate for growing a graphene monolayer is provided. The copper substrate may include a first copper layer characterized by: a first copper percentage by weight, a first oxygen percentage by weight, and a first thickness. The copper substrate may also include a second copper layer in contact with the first copper layer. The second copper layer may be characterized by: a second copper percentage by weight, a second oxygen percentage by weight, and a second thickness. In the copper substrate, the second copper percentage may be greater than the first copper percentage; the second oxygen percentage may be about the same or less than the first oxygen percentage; and the second average thickness may be less than the first average thickness. The second average thickness may be one atomic monolayer of copper to about 25 micrometers. The first average thickness may be at least about 3 micrometers. The second copper percentage may be greater than the first copper percentage by at least about 0.1%. In some examples, the second copper percentage may be at least about 99.9%; the first copper percentage may be less than about 99.9%; or the second copper percentage may be at least about 99.9% and the first copper percentage may be less than about 99.9%.

According to some examples, a graphene-copper composite is provided. The graphene-copper composite may include a first copper layer characterized by: a first copper percentage by weight, a first oxygen percentage by weight, and a first thickness. The graphene-copper composite may include a second copper layer having a first surface in contact with the first copper layer. The second copper layer may be characterized by: a second copper percentage by weight, a second oxygen percentage by weight, and a second thickness. The graphene-copper composite may also include a graphene monolayer in contact with a second surface of the second copper layer. In the graphene-copper composite, the second copper percentage may be greater than the first copper percentage; the second oxygen percentage may be about the same or less than the first oxygen percentage; and the second average thickness may be less than the first average thickness. The second average thickness may be one atomic monolayer of copper to about 25 micrometers. The first average thickness may be at least about 3 micrometers. The second copper percentage may be greater than the first copper percentage by at least about 0.1%. In some examples, the second copper percentage may be at least about 99.9%; the first copper percentage may be less than about 99.9%; or the second copper percentage may be at least about 99.9% and the first copper percentage may be less than about 99.9%.

According to some examples, a system for manufacturing a copper substrate for growing graphene is provided. The system may include a deposition chamber; a sample stage configured to hold a copper substrate in the deposition chamber; a copper deposition source; a cleaning agent source configured to direct cleaning agent to the copper substrate held by the sample stage; a sensor configured to determine a thickness of a layer deposited by the copper deposition source; a heater configured to heat the copper substrate held by the sample stage to an annealing temperature of about 750° C. to about 1000° C.; a gas source configured to provide a thermal annealing gas to the copper substrate held by the sample stage; and a microprocessor. The microprocessor may be coupled to the deposition chamber, the sample stage, the copper deposition source, the cleaning agent source, the sensor, and the heater. The microprocessor may be programmable to: employ the sample stage to hold a first copper layer in the deposition chamber; employ the cleaning agent source to direct cleaning agent to the first copper layer; employ the copper deposition source and the sensor to deposit a second copper layer on the first copper layer, wherein the second copper layer may be thinner compared to the first copper layer; and employ the heater and the gas source to thermally anneal the first copper layer at the copper substrate. The cleaning agent source may be configured to provide one or more of sputter cleaning, acid etching, solvent rinsing, electropolishing, or chemical mechanical polishing. The copper deposition source may be configured to deposit copper by one or more of sputtering, evaporation, electroplating, or chemical vapor deposition (CVD).

In various examples, the system may further include a chemical vapor source configured to provide one or more chemical vapor deposition precursors for forming graphene, wherein the microprocessor may be programmable to employ the chemical vapor source to grow a graphene monolayer at the second copper layer using the one or more chemical vapor deposition precursors for forming graphene.

In various examples of the system, the first copper layer may be characterized by a first oxygen percentage by weight and the microprocessor may be further programmable to employ the copper deposition source to deposit the second copper layer at a second oxygen percentage by weight that is about the same or less than the first oxygen percentage. In some examples of the system, in a dimension perpendicular to the graphene monolayer, the first copper layer is characterized by a first average thickness, and the microprocessor may be further programmable to employ the copper deposition source and the sensor to deposit the second copper layer at a second average thickness that is less than the first average thickness. The microprocessor may be further programmable to employ the copper deposition source and the sensor to deposit the second copper layer such that the second average thickness is one atomic monolayer of copper to about 25 micrometers.

In some examples of the system, the microprocessor may be programmable to employ the heater and the gas source to thermally anneal the first copper layer at an annealing temperature of about 750° C. to about 1000° C. The microprocessor may be programmable to employ the heater and the gas source to thermally anneal the first copper layer in an atmosphere that includes about 1 mole % hydrogen to about 10 mole % hydrogen, and about 90 mole % to about 99 mole % of one or more noble gases. The microprocessor may be programmable to employ the heater and the gas source to thermally anneal the first copper layer in an atmosphere substantially free of oxygen.

According to some examples, a computer-readable storage medium having instructions stored thereon for manufacturing a copper substrate for growing graphene is provided. The instructions may include providing a first copper layer; cleaning a surface of the first copper layer; depositing a second copper layer on the cleaned surface of the first copper layer to form the copper substrate; and thermally annealing the copper substrate. The first copper layer may be characterized by: a first copper percentage by weight, a first oxygen percentage by weight, and a first thickness. The second copper layer may be characterized by: a second copper percentage by weight, a second oxygen percentage by weight, and a second thickness. The second copper layer may be deposited such that one or more of: the second copper percentage may be greater than the first copper percentage, the second oxygen percentage may be about the same or less than the first oxygen percentage, and/or the second average thickness may be less than the first average thickness. The surface of the first copper layer may be cleaned by one or more of sputter cleaning, acid etching, solvent rinsing, electropolishing, or chemical mechanical polishing. The second copper layer may be deposited on the surface of the first copper layer by sputtering, evaporation, electroplating, or chemical vapor deposition (CVD). The second copper layer may be saturated in dissolved oxygen at the annealing temperature.

In various examples of the computer-readable storage medium, the instructions for thermal annealing may include heating to an annealing temperature of about 750° C. to about 1000° C. The instructions for thermal annealing may also include heating in an atmosphere that includes about 1 mole % hydrogen to about 10 mole % hydrogen, and about 90 mole % to about 99 mole % of one or more noble gases. The thermal annealing may include heating in an atmosphere substantially free of oxygen.

In some examples of the computer-readable storage medium, the instructions may further include growing a graphene monolayer via chemical vapor deposition on the second copper layer.

Example 1a

Preparation of 99.8% Purity Copper Surface

A 50×50 millimeter square of 99.8% copper foil may be prepared (100 micrometers thick, catalog #12816, Sigma-Aldrich, St. Louis Mo.). The 99.8% copper foil may be degreased by washing in acetone (≥99.9%, catalog #650501, Sigma-Aldrich, St. Louis Mo.), etched in 0.1 M acetic acid (≥99.99%, catalog #338826, Sigma-Aldrich, St. Louis Mo., diluted in distilled, deionized water to 0.1 M) at 25° C. for 5 minutes, washed with distilled, deionized water, and dried. The 99.8% copper foil may then be affixed to a machined stainless steel sample holder, placed in a chamber of a sputtering apparatus (Perkin-Elmer 4400 RF Sputtering Plasma Deposition System, Perkin-Elmer, Waltham Mass.), evacuated to about $4 \times 10^{-8}$ Pascals base pressure, and sputter cleaned for 3 min at 0.2 milliAmperes with Ar ions accelerated at 500 V.

Example 1B

Preparation of 99.999% Purity Copper Surface

A 99.8% copper foil sample may be provided under ultrahigh vacuum conditions (about $4 \times 10^{-8}$ Pascals base pressure) in the sputtering apparatus as described in Example 1A. The sputtering apparatus may be operated at a deposition temperature of 100° C., 200 W working power, and a deposition rate of approximately 1.2 nanometers/second. At the same time, the sample holder may be rotated at 100 rotations per minute to deposit 99.999% pure copper on the in a thickness of 0.1 micrometers on the 99.8% copper foil to form a two-layer copper composition. The two-layer copper composition may then be removed from the sputtering apparatus and heated in a fused silica tube furnace to a temperature of 850° C. for 30 minutes under an atmosphere of 95% Ar/5% $H_2$ at atmospheric pressure. The fused silica tube furnace may be cooled to provide an annealed two-layer copper substrate suitable for growing graphene as described herein.

Example 2a

Preparation of Graphene On the 99.8% Purity Copper Surface

A sample of the 99.8% pure copper as cleaned in Example 1A may be placed in the fused silica tube furnace, configured as a chemical vapor deposition (CVD) chamber. Hydrogen gas may be supplied at 2 standard cubic centimeters per minute (sccm) at a pressure of about 40 milliTorr. The 99.8% copper foil may be heated to a temperature of about 1000° C. over a period of about 45 minutes, and the temperature may be allowed to stabilize for another 15 minutes. Methane may be admitted at a flow of about 35 sccm to reach a total chamber pressure of about 500 milliTorr. The hydrogen flow may be continued at about 2 sccm. The graphene may be allowed to grow on the 99.8% copper foil for about 30 minutes. The CVD chamber heater may then be shut off, and the CVD chamber may be allowed to cool to ambient temperature over about 50 minutes. During cooling, the gas flow may be maintained at about 2 sccm of hydrogen and about 35 sccm of methane at a total pressure of 500 milliTorr.

Example 2B

Preparation of Graphene On the 99.999% Purity Copper Surface

A sample of the annealed two-layer copper substrate produced in Example 1B is placed in the CVD system with the top 99.999% copper layer exposed for chemical vapor deposition. The CVD system may be supplied with hydrogen gas at 2 sccm at a pressure of about 40 milliTorr. The annealed two-layer copper substrate may be heated to a temperature of about 1000° C. over a period of about 45 minutes, and the temperature may be allowed to stabilize for another 15 minutes. Methane may be admitted at a flow of about 35 sccm to reach a total chamber pressure of about 500 milliTorr. The hydrogen flow may be continued at about 2 sccm. The graphene may be allowed to grow on the 99.999% surface of the annealed two-layer copper substrate for about 30 minutes. The CVD chamber heater may then be shut off, and the CVD chamber may be allowed to cool to ambient temperature over about 50 minutes. During cooling, the gas flow may be maintained at about 2 sccm of hydrogen and about 35 sccm of methane at a total pressure of 500 milliTorr.

Example 2C

Comparison of Graphene Produced on High and Low Purity Surfaces

Graphene produced in Examples 2A and 2B, together with the respective underlying copper substrates, may each be imaged using an optical microscope. The images may be examined at a magnification of 150× and surveyed different defect morphologies (square, triangle, circle represent different morphologies of the defects observed with the optical microscope). The graphene of Example 2A, produced on the lower purity 99.8% copper surface, may have a defect areal density of about 8000 defects per square centimeter. The graphene of Example 2B, produced on the high purity 99.999% copper surface, may have a defect areal density of about 1000 defects per square centimeter.

Example 3a

Preparation of 99.8% Purity Copper Surface

A 25×25 millimeter square of 99.8% copper foil may be prepared (50 micrometers thick, catalog #35818, Alfa Aesar, Ward Hill, Mass.). The 99.8% copper foil may be degreased by washing in methanol (≥99.9%, catalog #34860, Sigma-Aldrich, St. Louis Mo.), etched in 0.1 M citric acid (≥99.9998%, catalog #94068, Sigma-Aldrich, St. Louis Mo., diluted in distilled, deionized water to 0.1 M) at 25° C. for 30 minutes, washed with distilled, deionized water, and dried. The 99.8% copper foil may then be affixed to a machined stainless steel sample holder, placed in the sputtering apparatus, evacuated to about $4>10^{-8}$ Pascals base pressure, and sputter cleaned for 2 min at 0.2 milliAmperes with Ar ions accelerated at 500 V.

Example 3B

Preparation of 99.999% Purity Copper Surface

A 99.8% copper foil sample may be provided under ultra-high vacuum conditions (about $4 \times 10^{-8}$ Pascals base pressure) in the sputtering apparatus as described in Example 3A. The sputtering apparatus may be operated at a deposition temperature of 100° C., 200 W working power, and a deposition rate of approximately 1.2 nanometers/second. At the same time, the sample holder may be rotated at 100 rotations per minute to deposit 99.999% pure copper on the in a thickness of 0.5 micrometers on the 99.8% copper foil to form a two-layer copper composition. The two-layer copper composition may then be removed from the sputtering apparatus and heated in a fused silica tube furnace to a temperature of 900° C. for 20 minutes under an atmosphere of 92.5% Ar/7.5% $H_2$ at atmospheric pressure. The fused silica tube furnace may be cooled to provide an annealed two-layer copper substrate suitable for growing graphene as described herein.

Example 4

Preparation of Graphene On the 99.999% Purity Copper Surface

A sample of the annealed two-layer copper substrate produced in Example 3B is placed in the CVD system with the 0.5 micrometer 99.999% copper layer exposed for chemical vapor deposition. The CVD system may be supplied with hydrogen gas at 2.2 sccm at a pressure of about 40 milliTorr. The annealed two-layer copper substrate may be heated to a temperature of about 1025° C. over a period of about 45 minutes, and the temperature may be allowed to stabilize for another 15 minutes. Methane may be admitted at a flow of about 40 sccm to reach a total chamber pressure of about 500 milliTorr. The hydrogen flow may be continued at about 2.2 sccm. The graphene may be allowed to grow on the 0.5 micrometer 99.999% surface of the annealed two-layer copper substrate for about 25 minutes. The CVD chamber heater may then be shut off, and the CVD chamber may be allowed to cool to ambient temperature over about 50 minutes. During cooling, the gas flow may be reduced to about 2 sccm of hydrogen and about 35 sccm of methane at a total pressure of 450 milliTorr.

Example 5a

Roll to Roll Preparation of 99.8% Purity Copper Surface

A 30×1000 centimeter sheet of 99.8% copper foil may be prepared (25 micrometers thick, catalog #13382, Alfa Aesar, Ward Hill, Mass.). The 99.8% copper foil may be loaded lengthwise into a roll to roll handling system and degreased by a cyclohexane spray (≥99.9%, catalog #650455, Sigma-Aldrich, St. Louis Mo.), etched by passing through a sonicated trough of 0.05 M oxalic acid (≥99.999%, catalog #658937, Sigma-Aldrich, St. Louis Mo., diluted in distilled, deionized water to 0.05 M), spray-washed with distilled, deionized water, and dried. The 99.8% copper foil may then be loaded in a roll to roll sputtering/CVD apparatus (KOBELCO LTD, Kobe, Japan), evacuated to about $10^{-7}$ Pascals base pressure, and continuously sputter cleaned at 0.2 milli-Amperes with Ar ions accelerated at 500 V, with the copper foil passing through the sputter zone at a rate of about 1 centimeter per minute.

Example 5B

Roll to Roll Preparation of 99.999% Purity Copper Surface

A 99.8% copper foil roll may be provided under ultra-high vacuum conditions (about $10^{-7}$ Pascals base pressure) in the roll to roll sputtering apparatus as described in Example 5A. The sputtering apparatus may be operated at a deposition temperature of 100° C. and a deposition rate of approximately 2 nanometers/second. At the same time, the roll to roll apparatus may be operated to pass the copper foil through the deposition zone at a rate corresponding to deposition of 99.999% pure copper in a thickness of 0.1 micrometers on the 99.8% copper foil to form a two-layer copper composition. The two-layer copper composition may then rolled through a furnace zone to a temperature of 900° C. under an atmosphere of 92.5% Ar/7.5% $H_2$ at atmospheric pressure, at a rate corresponding to about 20 min exposure to the furnace zone. The copper foil may be cooled to provide an annealed two-layer copper roll substrate suitable for growing graphene as described herein.

Example 6

Roll To roll Preparation of Graphene On the 99.999% Purity Copper Surface

A sample of the annealed two-layer copper roll substrate produced in Example 3B is placed in the roll-to-roll CVD system with the 0.1 micrometer 99.999% copper layer exposed for chemical vapor deposition. The CVD system may be supplied with hydrogen gas at 8 sccm at a pressure of about 90 milliTorr. The annealed two-layer copper substrate may be heated to a temperature of about 1000° C. over a period of about 45 minutes, and the temperature may be allowed to stabilize for another 15 minutes. Methane may be admitted at a flow of about 24 sccm to reach a total chamber pressure of about 450 milliTorr. The hydrogen flow may be continued at about 8 sccm. The graphene may be allowed to grow on the 0.1 micrometer 99.999% surface of the annealed two-layer copper substrate at a roll rate corresponding to about 25 minutes in the CVD deposition zone. The copper substrate may be rolled through a cooling gradient zone under hydrogen gas flow at 8 sccm until ambient temperature is reached. The result is a monolayer coating of graphene on the two-layer copper roll substrate.

The terms "a" and "an" as used herein mean "one or more" unless the singular is expressly specified. For example, reference to "a base" may include a mixture of two or more bases, as well as a single base.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to, plus or minus 10% of the particular term.

As used herein, the terms "optional" and "optionally" mean that the subsequently described circumstance may or may not occur, so that the description includes instances where the circumstance occurs and instances where it does not.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical manufacturing system may be implemented utilizing any suitable commercially available components, such as those typically found in data computing/communication and/or network computing/communication systems. The herein described subject matter sometimes illustrates different components contained within, or coupled together with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group. As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. For example, a group having 1-3 cells refers to groups having 1, 2, or 3 cells. Similarly, a group having 1-5 cells refers to groups having 1, 2, 3, 4, or 5 cells, and so forth. While various aspects and embodiments have been disclosed herein, other aspects and embodiments will be apparent to those skilled in the art.

The various aspects and embodiments disclosed herein are for purposes of illustration and are not intended to be limiting, with the true scope and spirit being indicated by the following claims.

What is claimed is:

1. A method to manufacture graphene, comprising:
providing a copper substrate that includes a first copper layer in contact with a second copper layer, the first copper layer thermally annealed to the second copper layer at a thermal annealing temperature within one of a vacuum and one or more noble gases, the first copper layer characterized by a first copper percentage by weight and the second copper layer characterized by a second copper percentage by weight,
wherein the second copper percentage by weight is greater than the first copper percentage by weight; and
growing a graphene monolayer via chemical vapor deposition on the second copper layer, wherein a defect areal density of the graphene monolayer grown on the second copper layer includes about 1000 defects per square centimeter of the graphene monolayer.

2. The method of claim 1, wherein:
the first copper layer is further characterized by a first oxygen percentage by weight;
the second copper layer is further characterized by a second oxygen percentage by weight; and
the second oxygen percentage by weight is about the same or less than the first oxygen percentage by weight.

3. The method of claim 1, wherein in a dimension perpendicular to the graphene monolayer,
the first copper layer is characterized by a first average thickness;
the second copper layer is characterized by a second average thickness; and
the second average thickness is less than the first average thickness.

4. The method of claim 3, wherein the first average thickness is at least about 3 micrometers and the second average thickness is one atomic monolayer of copper to about 25 micrometers.

5. The method of claim 1, wherein providing the copper substrate includes:
providing the first copper layer;
cleaning a surface of the first copper layer;
depositing the second copper layer on the cleaned surface of the first copper layer to form the copper substrate; and
thermally annealing the copper substrate.

6. The method of claim 5, wherein the surface of the first copper layer is cleaned by one or more of sputter cleaning, acid etching, solvent rinsing, electropolishing, or chemical mechanical polishing.

7. The method of claim 5, wherein the second copper layer is deposited on the surface of the first copper layer by one or more of sputtering, evaporation, electroplating, or chemical vapor deposition (CVD).

8. The method of claim 5, wherein the second copper layer is saturated in dissolved oxygen at the annealing temperature.

9. The method of claim 5, wherein the thermal annealing includes heating in an atmosphere comprising:
about 1 mole % hydrogen to about 10 mole % hydrogen; and about 90 mole % to about 99 mole % of one or more noble gases.

* * * * *